(12) United States Patent
Thareja et al.

(10) Patent No.: US 11,462,411 B2
(45) Date of Patent: Oct. 4, 2022

(54) GATE CONTACT OVER ACTIVE REGIONS

(71) Applicant: Applied Materials, Inc., Santa Clara, CA (US)

(72) Inventors: Gaurav Thareja, Santa Clara, CA (US); Keyvan Kashefizadeh, Dublin, CA (US); Xikun Wang, Sunnyvale, CA (US); Anchuan Wang, San Jose, CA (US); Sanjay Natarajan, Portland, OR (US); Sean M. Seutter, Munich (DE); Dong Wu, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 45 days.

(21) Appl. No.: 17/242,375

(22) Filed: Apr. 28, 2021

(65) Prior Publication Data

US 2021/0249270 A1     Aug. 12, 2021

Related U.S. Application Data

(62) Division of application No. 16/442,797, filed on Jun. 17, 2019, now Pat. No. 11,004,687.

(Continued)

(51) Int. Cl.
*H01L 21/283*     (2006.01)
*H01L 29/49*      (2006.01)
(Continued)

(52) U.S. Cl.
CPC ...... *H01L 21/28088* (2013.01); *H01L 21/283* (2013.01); *H01L 29/45* (2013.01); *H01L 29/4966* (2013.01)

(58) Field of Classification Search
CPC . H01L 21/28088; H01L 21/283; H01L 29/45; H01L 29/4966
(Continued)

(56) References Cited

U.S. PATENT DOCUMENTS

| 9,461,143 | B2  | 10/2016 | Pethe et al. |
| 2006/0121678 | A1* | 6/2006 | Brask ............... H01L 29/66545 |
| | | | 257/E21.444 |

(Continued)

FOREIGN PATENT DOCUMENTS

KR     10-2007-0082758 A     8/2007

OTHER PUBLICATIONS

Leading at the Edge. Technology and Manufacturing Day. Intel. 2017-2020.
(Continued)

*Primary Examiner* — Didarul A Mazumder
(74) *Attorney, Agent, or Firm* — Patterson + Sheridan, LLP

(57) ABSTRACT

A semiconductor device fabrication process includes forming gates on a substrate having a plurality of openings, each gate having a conducting layer a first metal and a gate dielectric layer of a first dielectric material, partially filling the openings with a second dielectric material, forming a first structure on the substrate in a processing system without breaking vacuum, depositing a third dielectric material over the first structure, and forming a planarized surface of the gates and a surface of the third dielectric material that is disposed over the first structure. The forming of the first structure includes forming trenches by removing second portions of the second dielectric material within each opening, forming recessed active regions in the trenches by partially filling the trenches with a second metal, forming a liner over each recessed active region, and forming a metal cap layer over each liner.

20 Claims, 12 Drawing Sheets

Related U.S. Application Data

(60) Provisional application No. 62/837,847, filed on Apr. 24, 2019, provisional application No. 62/804,156, filed on Feb. 11, 2019.

(51) Int. Cl.
    *H01L 21/28*     (2006.01)
    *H01L 29/45*     (2006.01)

(58) Field of Classification Search
    USPC .......................................................... 257/368
    See application file for complete search history.

(56) References Cited

U.S. PATENT DOCUMENTS

| | | | |
|---|---|---|---|
| 2008/0237743 A1* | 10/2008 | Ramin | H01L 21/28097 |
| | | | 257/E21.639 |
| 2015/0170956 A1 | 6/2015 | Naik et al. | |
| 2015/0270171 A1 | 9/2015 | Basker et al. | |
| 2017/0047253 A1* | 2/2017 | Park | H01L 21/31105 |
| 2017/0194332 A1 | 7/2017 | Lytle | |
| 2017/0194452 A1 | 7/2017 | Alptekin et al. | |
| 2018/0122915 A1 | 5/2018 | Cheng et al. | |
| 2019/0318955 A1* | 10/2019 | Wallner | H01L 29/66545 |
| 2020/0006552 A1* | 1/2020 | Anderson | H01L 21/823487 |
| 2020/0083345 A1* | 3/2020 | Canaperi | H01L 29/785 |

OTHER PUBLICATIONS

Search Report dated May 27, 2020 for Application No. PCT/US2020/012927.

* cited by examiner

GATE CONTACT OVER ACTIVE REGIONS

CROSS-REFERENCE TO RELATED APPLICATIONS

This application is a divisional of co-pending U.S. patent application Ser. No. 16/442,797, filed Jun. 17, 2019, which claims benefit of U.S. Provisional Patent Applications Nos. 62/804,156, filed Feb. 11, 2019 and 62/837,847, filed Apr. 24, 2019, the entire contents of which are incorporated herein by reference.

BACKGROUND

Field

Embodiments of the present disclosure generally relate to semiconductor device fabrication processes and structures, more specifically, to semiconductor devices with a low-k cap layer and a self-aligned contact.

Description of the Related Art

In recent micro-electronics devices, transistors are integrated within high density in integrated circuits. However, once the gate length reached around 20 nm, transistor performance is affected by short-channel effects, such as current leakage between the source and drain even in the "off" state when the current flow should have been turned off. The device structures have been thus transformed from two dimensional (2D) planar structures to three dimensional (3D) structures, such as fin-field-effective-transistors (FinFET), in which gates surround devices and nanowire or nano-sheet devices. Unlike 2D devices, fabrication of 3D devices faces more challenges in advanced lithography for patterning nano-scaled transistors, process integration, wet and dry etching, gate formation including deposition of high-k material and metal gate. Thus, there is a need for improved device fabrication processes and structures.

SUMMARY

Embodiments described herein generally related to improved device fabrication processes and structures. In one embodiment, a semiconductor device fabrication process includes forming gates on a substrate by removing first portions of a gate layer to form a plurality of openings, wherein the gate layer comprises a conducting layer made of a first metal and a gate dielectric layer made of a first dielectric material disposed on the conducting layer, partially filling the plurality of openings with a second dielectric material, forming a first structure on the substrate in a processing system without breaking vacuum, depositing a third dielectric material over the first structure, forming a planarized surface that comprises a surface of the gates and a surface of the third dielectric material that is disposed over the first structure, and forming contact via openings in the trenches by removing third portions of the third dielectric material in the trenches. The forming of the first structure includes forming a plurality of trenches by removing second portions of the second dielectric material disposed within each of the plurality of openings, forming recessed active regions in the plurality of trenches by partially filling the plurality of trenches with a second metal, forming a liner over each of the recessed active regions, and forming a metal cap layer over each of the liners.

In another embodiment, a semiconductor device fabrication process includes forming gates on a substrate by removing first portions of a gate layer to form a plurality of openings, wherein the gate layer comprises a conducting layer made of a first metal and a gate dielectric layer made of a first dielectric material disposed on the conducting layer, partially filling the plurality of openings with a second dielectric material, forming a first structure on the substrate in a processing system without breaking vacuum, forming planarized surface that comprises a surface of the gates and a surface of the first structure, and forming contact via openings in the trenches by removing third portions of the third dielectric material in the trenches. The forming of the first structure includes forming a plurality of trenches by removing second portions of the second dielectric material disposed within each of the plurality of openings, forming recessed active regions in the plurality of trenches by partially filling the plurality of trenches with a second metal, forming a liner over each of the recessed active regions, forming a metal cap layer over each of the liners, and depositing a third dielectric material over the metal cap layers.

In another embodiment, a semiconductor structure includes a first gate and a second gate made of a first metal on a substrate, gate cap layers made of a first dielectric material on the first and second gates, a trench between the first gate and the second gate, a recessed active region made of a second metal formed in the trench, spacers made of a second dielectric material on sidewalls of the first and second gates to electrically isolate the recessed active region from the first and second gates, a liner disposed over the recessed active region, a metal cap layer disposed over the liner, and a contact via opening in the trench connectable to a self-aligned contact gate formed therein, the self-aligned contact gate electrically connecting to the recessed active region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments of the present disclosure provided herein generally include a device and method of forming a device that has an improved gate contact structure that is formed over active regions of a semiconductor device. In some embodiments, the improved gate contact structure is a self-aligned contact gate formed in a patterned contact via opening. The methods described herein may be used for the fabrication of micro-electronics devices at a reduced size. The improved gate contact structure generally includes a semiconductor gate region structure, such as the semiconductor structure 200 which is described below. More specifically, the methods described herein form permanent gates prior to formation of a gate contact structure and thus eliminate the need to replace dummy gates (e.g., polysilicon or silicon nitride) with the permanent gates during the fabrication process. The improved gate structure further includes a liner between an active region and a dielectric material thereon, such that the active region is protected from interacting with the dielectric material. The improved gate structure may have different dielectric materials on the active regions and the permanent gates, which allows selective removal of the dielectric materials over the active regions, and thus self-aligned gates can be placed accurately over the active regions. Furthermore, some steps of the methods described herein are performed in a processing system while maintaining vacuum pressures and without exposing the semiconductor structures to an ambient environment when being transferred from one processing chamber to another processing chamber, thus preventing damages to the semiconductor structures being fabricated.

Figure 1:
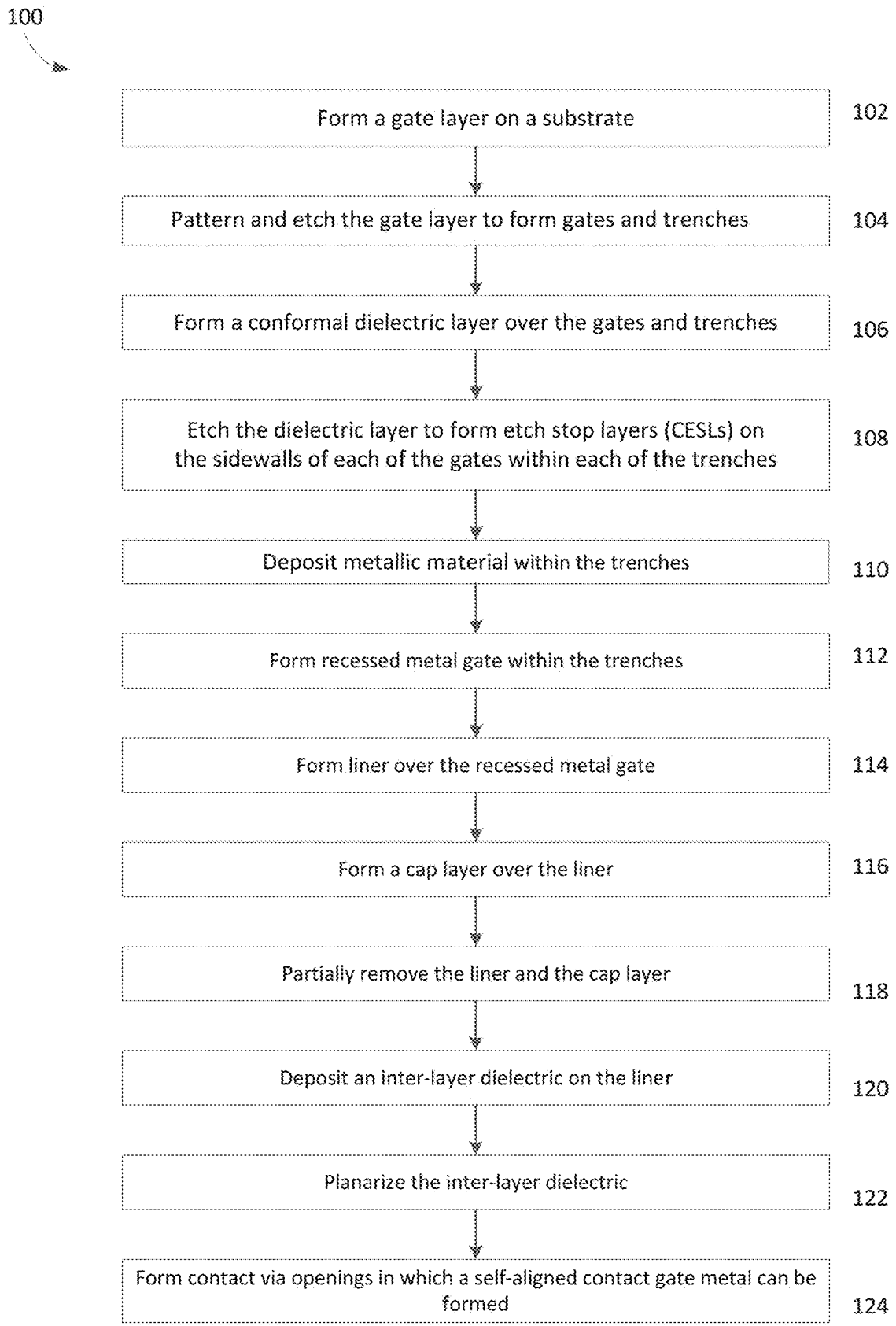
FIG. 1 is a flow chart of method steps for forming a semiconductor structure, according to one embodiment.

FIG. 1 is a flow chart of method steps for the formation of an improved gate contact structure, according to one or more embodiments of the disclosure provided herein. FIGS. 2-11 are schematic side views of portions of the improved gate contact structure that illustrate the improved gate contact structure during at least one of the intermediate method steps illustrated in FIG. 1. Although the method steps illustrated in FIG. 1 are described sequentially, persons skilled in the art will understand that other process sequences that include one or more method steps that have been omitted and/or added, and/or has been rearranged in another desirable order, fall within the scope of the embodiments of the disclosure provided herein.

Figure 2:
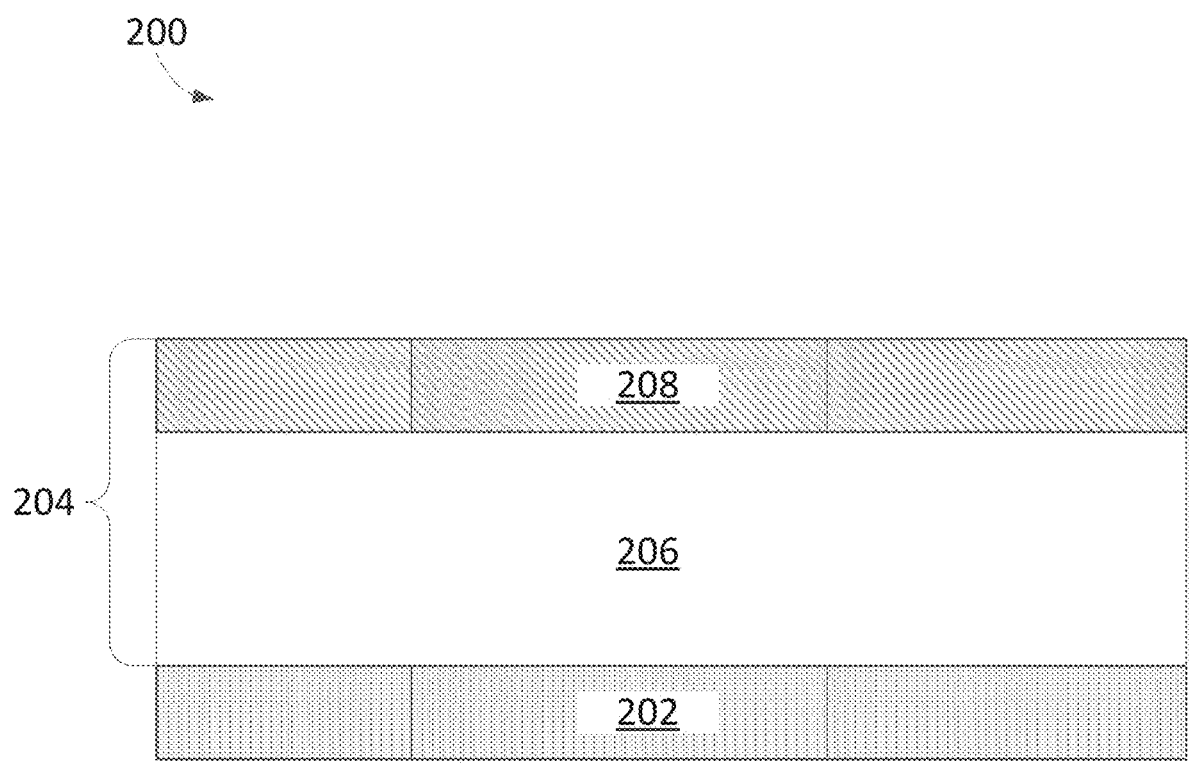
FIG. 2 is a cross-sectional view of an initial stage in the formation of the semiconductor structure, according to one embodiment.

In block 102 of FIG. 1, a gate layer 204 is formed on a substrate 202. FIG. 2 is a cross-sectional view of a semiconductor structure 200 at this initial stage. The semiconductor structure 200 may include a gate layer 204 on a substrate 202.

The gate layer 204 may include a conducting layer 206 on the substrate 202. The conducting layer 206 is an electrically conductive layer that may include a metal such as tungsten (W), titanium nitride (TiN), aluminum (Al)-doped titanium carbide (such as TiAlC, $Ti_3AlC_2$, $Ti_3AlC$, $Ti_2AlC$), copper (Cu), nickel (Ni), cobalt (Co), metal-semiconductor alloy, or any suitable combination of those materials. The substrate 202 may be any semiconducting material such Si-containing materials, germanium-containing materials, gallium arsenide (GaAs), indium arsenide (InAs) and other like semiconductors. Silicon (Si)-containing materials include silicon (Si), bulk silicon, single crystal silicon, polycrystalline silicon, silicon-germanium (SiGe), amorphous silicon, silicon-on-insulator substrates (SOI), SiGe-on-insulator (SGOI), annealed polycrystalline silicon, and polycrystalline silicon line structures. In some embodiments, the substrate 202 may have a thickness about 30 nm or greater. One or more additional layers (not shown) may be disposed between the conducting layer 206 and the surface of the substrate 202, such as a gate dielectric layer and/or one or more work function tuning layers.

The conducting layer 206 may be formed on the substrate 202 by chemical vapor deposition (CVD), plating, sputtering, physical vapor deposition (PVD), or the like in a first processing chamber. In some embodiments, the conducting layer 206 may have a thickness ranging from about 10 nm to about 200 nm. The conducting layer 206 may be doped with elements such as boron, phosphorus, or arsenic. The dopants may be introduced during or subsequent to deposition of the conducting layer 206. In some embodiments, the conducting layer 206 may comprise multiple layers that are used to alter device characteristics such as threshold voltage and gate conductance.

The gate layer 204 may further include a gate dielectric layer 208 on the conducting layer 206. The gate dielectric layer 208 may be made of silicon nitride (SiN), silicon carbide (SiC), aluminum oxide ($Al_2O_3$), hafnium oxide ($HfO_2$), zirconium oxide ($ZrO_2$), silicon dioxide ($SiO_2$), silicon oxy-nitride ($SiO_xN_y$), or carbon-doped silicon nitride. The gate dielectric layer 208 may be deposited on the conducting layer 206 by chemical vapor deposition (CVD), rapid thermal chemical vapor deposition (RTCVD), low-pressure chemical vapor deposition (LPCVD), plasma enhanced chemical vapor deposition (PECVD), or the like in a second processing chamber. In some embodiments, the gate dielectric layer 208 may have a thickness ranging from about 15 nm to about 80 nm.

Figure 3:
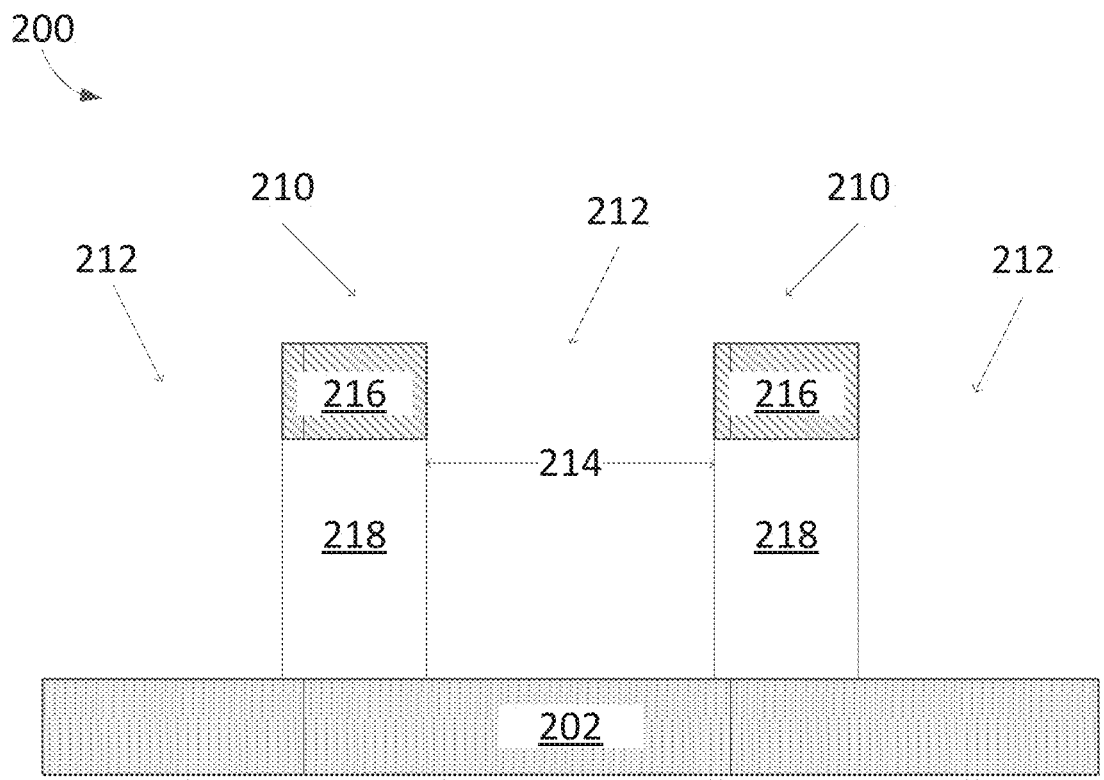
FIG. 3 is a cross-sectional view of an intermediate stage in the formation of the semiconductor structure, according to one embodiment.

In block 104 of FIG. 1, gates 210 and trenches 212 are formed. FIG. 3 is a cross-sectional view of the semiconductor structure 200 at this intermediate stage of a device fabrication process.

The gates 210 and trenches 212 are formed by patterning and etching portions of the gate layer 204 by a conventional dry etching process, such as reactive-ion etching (RIE) or plasma etching in a third processing chamber. In some embodiments, the gate dielectric layer 208 may be etched and then utilized as an etch mask during the etch process. In some embodiments, for 20 nm and 14 nm node devices, immersion photolithography with ultraviolet light at 193 nm wavelength through the use of multiple patterning may be used, and for 7 nm node, the immersion photolithography at 193 nm with self-aligned double patterning (SADP) and self-aligned quadruple patterning (SAQP) may be used. The gates 210 may have an aspect ratio (that is, a ratio of their height in the Z-direction to width in the X-direction) greater than or about 2, greater than or about 5, greater than or about 10, greater than or about 20, greater than or about 30, greater than or about 50, or more in some embodiments. Gate cap layers 216 remain from the gate dielectric layer 208 and gate conductors 218 remain from the conducting layer 206.

Trench openings 214 as shown in FIG. 3 may be smaller or about 15 nm in some embodiments.

At this stage, the gates 210 include the gate conductors 218 made of a metal such as tungsten (W), titanium nitride (TiN), aluminum (Al)-doped titanium carbide (such as TiAlC, $Ti_3AlC_2$, $Ti_3AlC$, $Ti_2AlC$), copper (Cu), nickel (Ni), cobalt (Co), metal-semiconductor alloy, or any suitable combination of those materials. Thus, a conventional gate replacement process, in which dummy gate materials, such as polycrystalline silicon or silicon nitride, are removed and replaced with metal, is not required in the fabrication process sequence described herein. The processes described herein thus significantly increase the device yield and reduce the number of processing steps and complexity of the process sequence used to form a gate contact structure.

Figure 4:
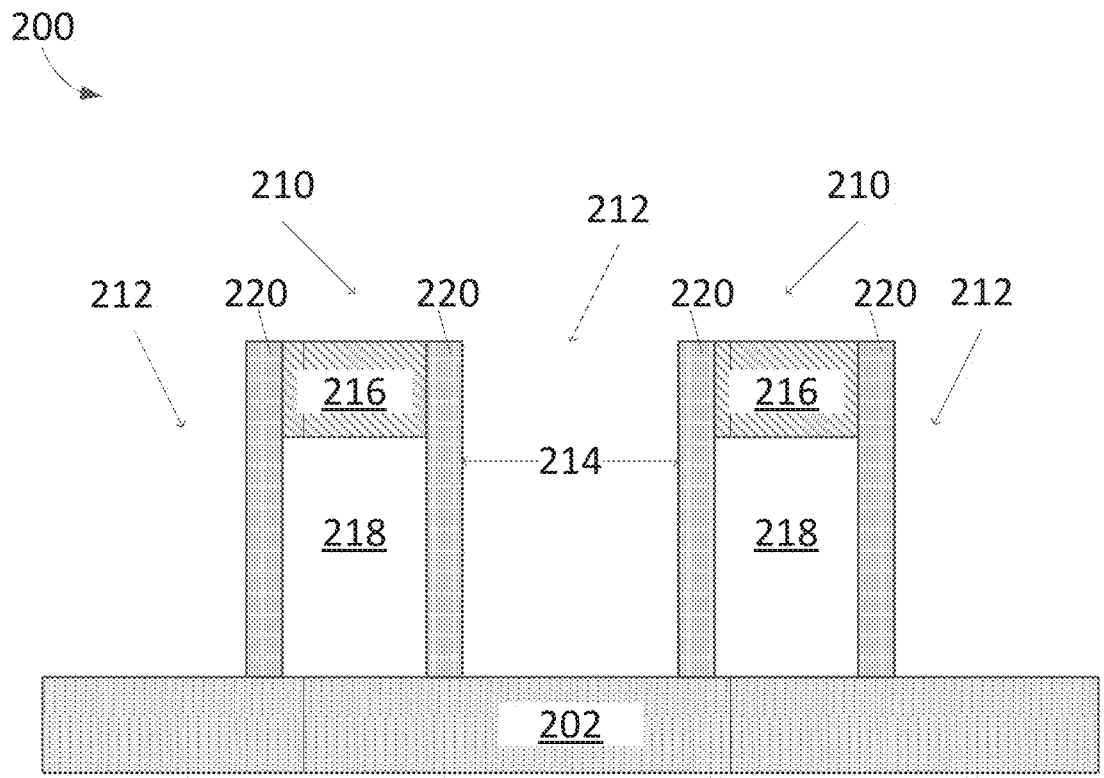
FIG. 4 is a cross-sectional view of an intermediate stage in the formation of the semiconductor structure, according to one embodiment.

In blocks 106 and 108 of FIG. 1, contact etch stop layers (CESLs) 220 are formed on the sidewalls of the gates 210. FIG. 4 is a cross-sectional view of the semiconductor structure 200 at this intermediate stage of the device fabrication process. The process of forming the CESL 220 on the sidewalls of the gates 210 may include forming a conformal dielectric layer (not shown) over the gates 210 and trenches 212 in block 106 and then dry etching the structures to remove the deposited layers from the top surfaces of the gates 210 and lower portion of the trenches 212 in block 108. In one embodiment, the conformal CESL 220 is formed (in block 106) using plasma enhanced chemical vapor deposition (PECVD) process in a fourth processing chamber, although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used. The dry etching process used to remove the deposited layers from the top surfaces of the gates 210 and lower portion of the trenches 212 (in block 108) may be performed in a fifth processing chamber that is configured to bias the substrate on which the semiconductor structure 200 is disposed while a plasma containing etching chemistry is formed thereover.

The CESLs 220 may be made of a low-k dielectric material, such as silicon carbide-boron nitride (SiCBN), silicon oxycarbide nitride (SiCON), silicon oxynitride (SiON), silicon nitride (SiN), silicon dioxide ($SiO_2$), silicon carbide (SiC), silicon nitride carbide (SiCN), boron nitride (BN), silicon boron nitride (SiBN), titanium nitride (TiN), and combinations thereof. In some embodiments, the CESLs 11 may have a thickness between about 5 nm and about 10 nm. The CESLs 220 may function as spacers to electrically isolate a recessed metal gate 602 (shown in FIG. 6) from the gates 210.

Figure 5:
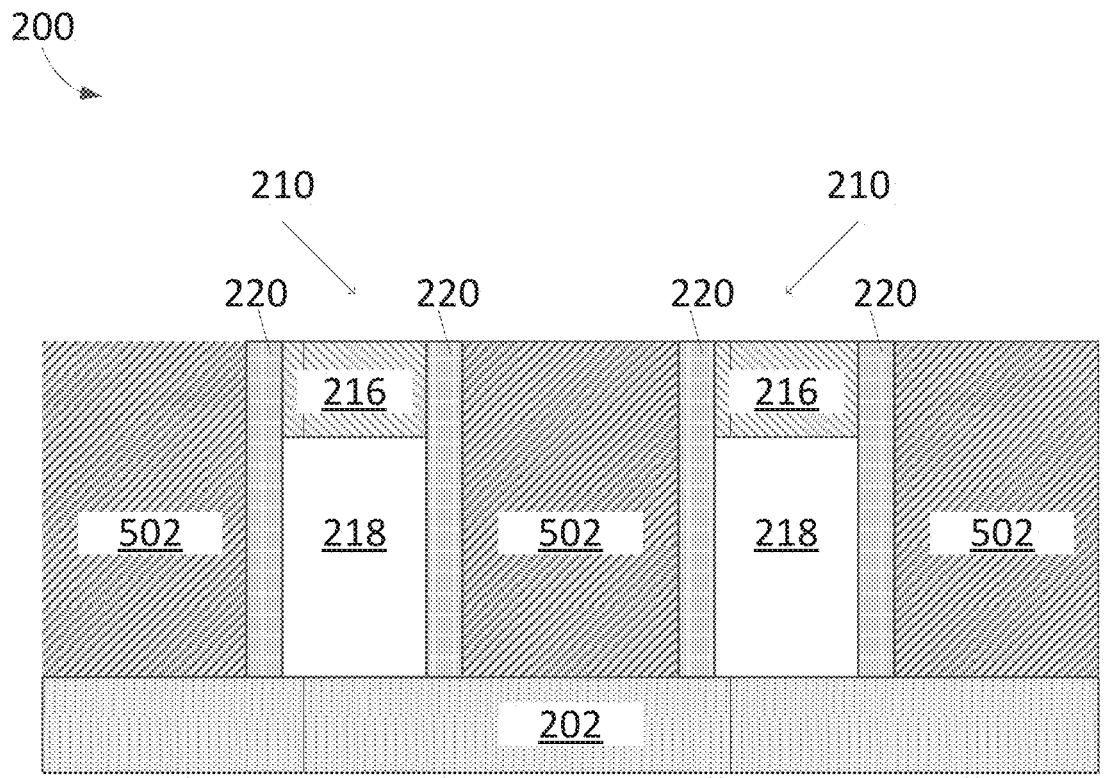
FIG. 5 is a cross-sectional view of an intermediate stage in the formation of the semiconductor structure, according to one embodiment.

In block 110 of FIG. 1, a metallic material 502 such as cobalt is deposited by use of a physical vapor deposition (PVD) process within the trench 212 in a sixth processing chamber. FIG. 5 is a cross-sectional view of the semiconductor structure 200 at this intermediate stage of the device fabrication process.

When deposited by use of a physical vapor deposition (PVD) process, the metallic material 502 may produce an overhang, which may be a portion of a layer that forms across the trench opening 214. In some embodiments, a chlorine-containing precursor and a nitrogen-containing precursor may be flowed into a substrate processing region (not particularly depicted) to remove the overhang.

Figure 6:
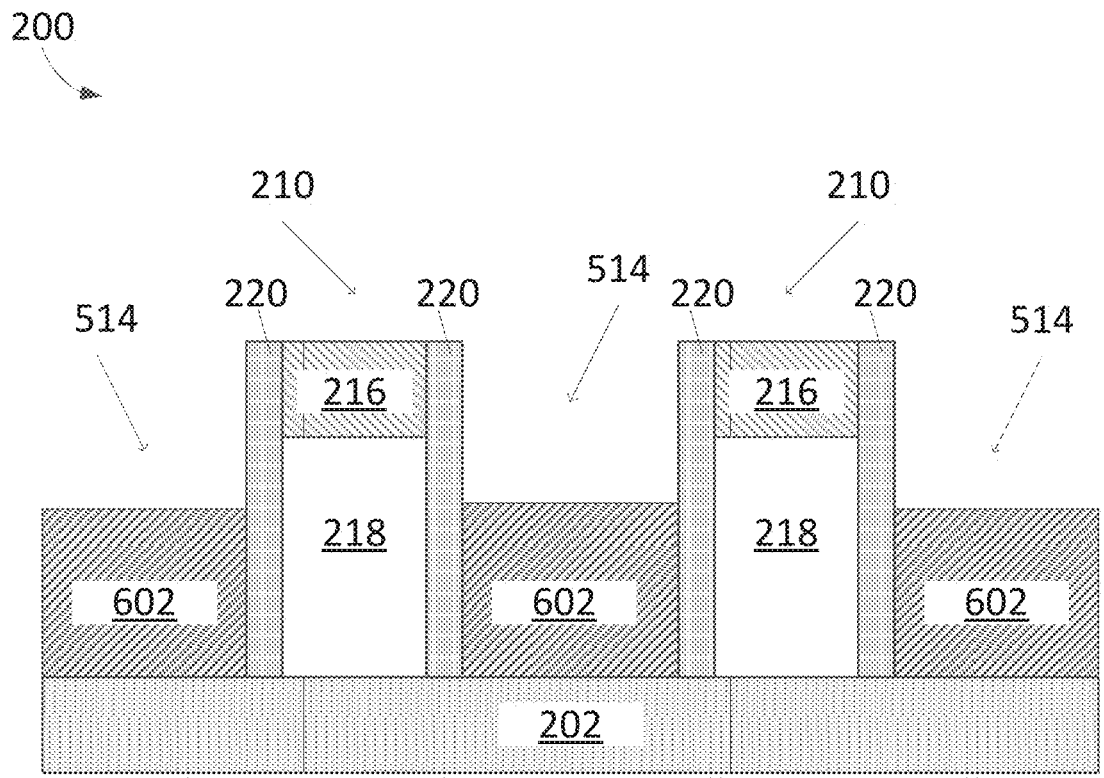
FIG. 6 is a cross-sectional view of an intermediate stage in the formation of the semiconductor structure, according to one embodiment.

In block 112 of FIG. 1, the metallic material 502 deposited within the trench 212 is partially removed to form a recessed metal gate (also referred to as "active region") 602 by an atomic layer etch (ALE) process in a seventh processing chamber, such as a plasma enhanced chemical vapor deposition processing chamber (PECVD) or a plasma enhanced atomic layer deposition process (PEALD) chamber. FIG. 6 is a cross-sectional view of the semiconductor structure 200 at this intermediate stage of the device fabrication process.

Figure 7:
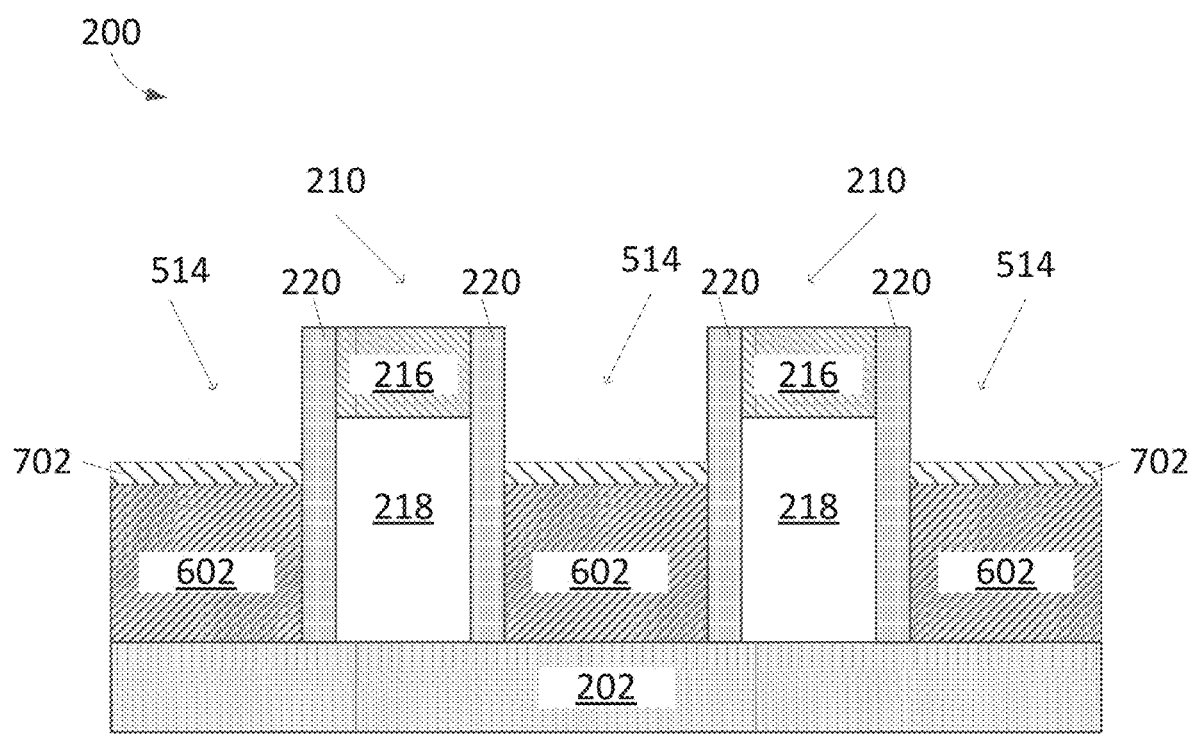
FIG. 7 is a cross-sectional view of an intermediate stage in the formation of the semiconductor structure, according to one embodiment.

In block 114 of FIG. 1, a liner 702 is deposited over the exposed surfaces of the semiconductor structure 200. FIG. 7 is a cross-sectional view of the semiconductor structure 200 at this intermediate stage. The liner 702 may have any thickness suitable to adhere to the underlying layer, act as a barrier layer and facilitate the formation the dielectric layer thereon. In one example, the liner 702 may have a thickness of about 10 to about 50 angstroms.

In block 114 of FIG. 1, the liner 702 may be formed over the semiconductor structure 200 within an eighth processing chamber by a plasma enhanced chemical vapor deposition process (PECVD) or a plasma enhanced atomic layer deposition process (PEALD). The liner 702 may comprise a metal such as titanium (Ti) or a metal nitride, such as titanium nitride (TiN), tantalum nitride (TaN), tungsten nitride (WN), or the like, deposited by any suitable deposition process, for example, atomic layer deposition (ALD), chemical vapor deposition (CVD), physical vapor deposition (PVD), or the like in the eighth processing chamber. In one example, the liner 702 includes titanium nitride (TiN) deposited by a PVD deposition process. Deposition of titanium nitride (TiN) via a PVD deposition process utilizes a source material is titanium (Ti) and a deposition gas mixture is a nitrogen containing gas such as nitrogen ($N_2$). The nitrogen containing gas may be provided at a flow rate of between about 30 to about 200 sccm. The flow rate of the nitrogen containing gas may be varied to control the reaction between the nitrogen containing gas and the titanium and the source material of the target, thus controlling the composition of nitrogen to the source material in the deposited layer. In some embodiments the deposition gas mixture may also include an inert gas, such as argon (Ar). When present, the inert gas may be provided at a flow rate of up to about 100 sccm. The nitrogen containing gas and the inert gas may be pre-mixed and provided to the processing chamber together, or to the processing chamber via separate conduits and/or gas sources (not specifically depicted). In some embodiments, to facilitate deposition of the ejected atoms of the target material during a PVD process, a bias power in the form of RF power may be applied to the substrate 202 via an electrode (not particularly depicted). In some embodiments, 1 kW to about 5 kW of RF power may be supplied at a frequency of between 0.02 to about 100 MHz. In some embodiments, the liner 702 may comprise multiple layers, for example, a first layer and second layer. The first layer may comprise titanium nitride (TiN) and the second layer may comprise tantalum nitride (TaN). The first layer may have a thickness of about 10 to about 20 angstroms, or about 20 angstroms, and the second layer may have a thickness of about 10 to about 20 angstroms, or about 25 angstroms.

Figure 8:
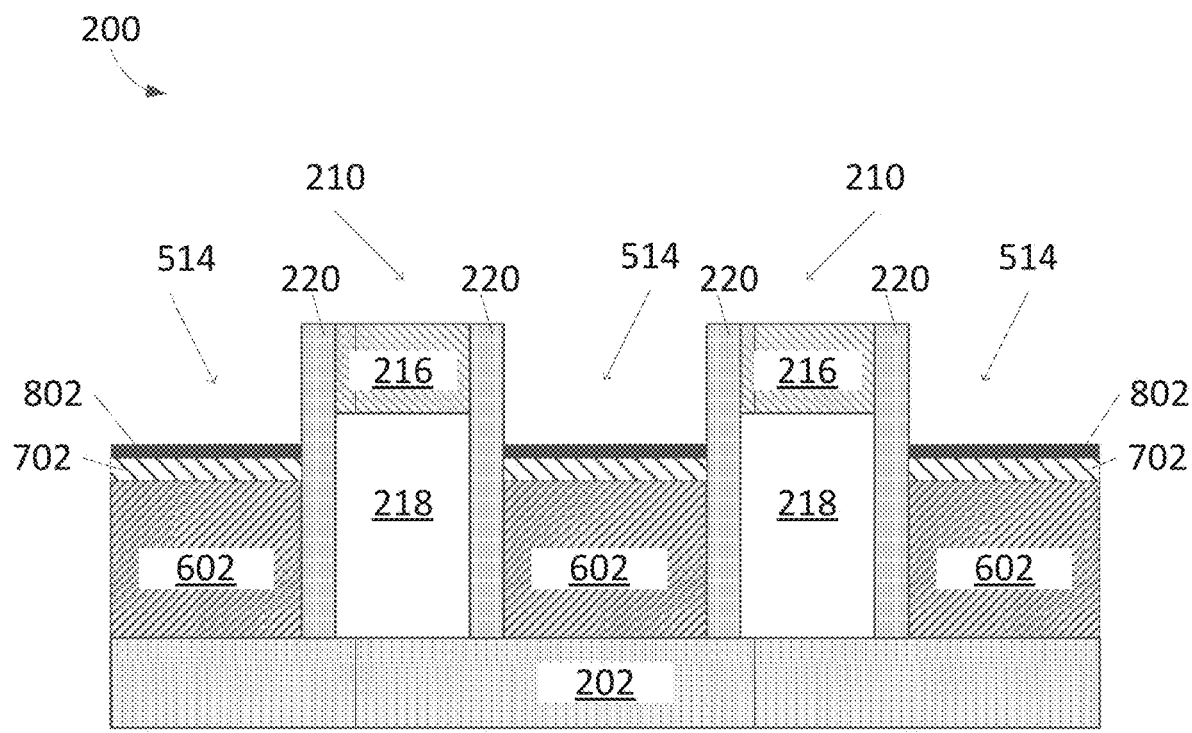
FIG. 8 is a cross-sectional view of an intermediate stage in the formation of the semiconductor structure, according to one embodiment.

In block 116 of FIG. 1, a metal cap layer 802 is deposited over the exposed surfaces of the semiconductor structure 200. FIG. 8 is a cross-sectional view of the semiconductor structure 200 at this intermediate stage. The cap layer 802 serves as a suitable surface for a subsequent formation of a dielectric layer described below and may also serve to prevent diffusion of metallic material 502 (e.g., cobalt) into the subsequently formed dielectric layer(s). The metal cap layer 802 may comprise tungsten (W). In a ninth processing chamber, the semiconductor structure 200 is exposed to plasma formed from a metal containing precursor, such as a tungsten containing precursor. In some embodiments, suitable tungsten precursors may include $WF_6$, $W(CO)_6$, CpW $(CO)_2NO$. $EtCpW(CO)_2NO$, $Cp*W(CO)_3NO$, $Cp_2WH_2$, $C_4H_9CNW(CO)_5$, $(C_5H_{11}CN)W(CO)_5$, $W(C_3H_5)_4$, $W(C_3H_4CH_3)_4$, $W(C_4H_6)_3$, $W(C_4H_6)_2(CO)_2$, and $W(C_4H_6)(CO)_4$. In some embodiments, plasma may be formed from a fluorine free tungsten halide precursor, such as tungsten pentachloride ($WCl_5$) or tungsten hexachloride ($WCl_6$). In some embodiments, a reactant gas, such as a hydrogen containing gas (e.g., hydrogen ($H_2$) or ammonia ($NH_3$)), and a carrier gas, such as argon, helium, or nitrogen may be added to the tungsten precursor gas to advantageously minimize the presence of carbon impurities in the metal cap layer 802. The carrier gas may be provided at a flow rate of about 100 sccm to about 3000 sccm. The plasma may be formed by sufficient energy supplied by, for example radio frequency (RF) energy from a power source. The power source may provide about 50 W to about 1.2 kW, of power at a suitable frequency, such as about 13.56 MHz. The plasma facilitates a decomposition of the precursors, causing a deposition of tungsten on the cobalt in the recess 514 and the gates 210 to form the metal cap layer 802. In some embodiments, the processing chamber is maintained at a pressure of about 0.5 to about 40 Torr and a temperature about 125° C. to about 425° C. during the deposition of the metal cap layer 802. In some embodiments, the metal cap layer 802 is made of ruthenium (Ru).

Referring back to FIG. 1 and FIG. 8, after forming the liner 702 and the metal cap layer 802 over the exposed surfaces of the semiconductor structure 200, in block 118, portions of the liner 702 and the metal cap layer 802 over gates 210 may be removed by a patterning and conventional dry etching process, such as reactive-ion etching (RIE) or plasma etching in a tenth processing chamber. The dry etching process used to remove the deposited liner 702 and the deposited metal cap layer 802 from the top surfaces of the gates 210 may be performed by use of a lithography process sequence and use of a separate conventional dry etch chamber that is configured to bias the substrate on which the semiconductor structure 200 is disposed while a plasma containing etching chemistry is formed thereover. Alternately, in some embodiments, the liner 702 and the metal cap layer 802 over gates 210 may be removed by a conventional chemical mechanical polishing (CMP) process.

Figure 9:
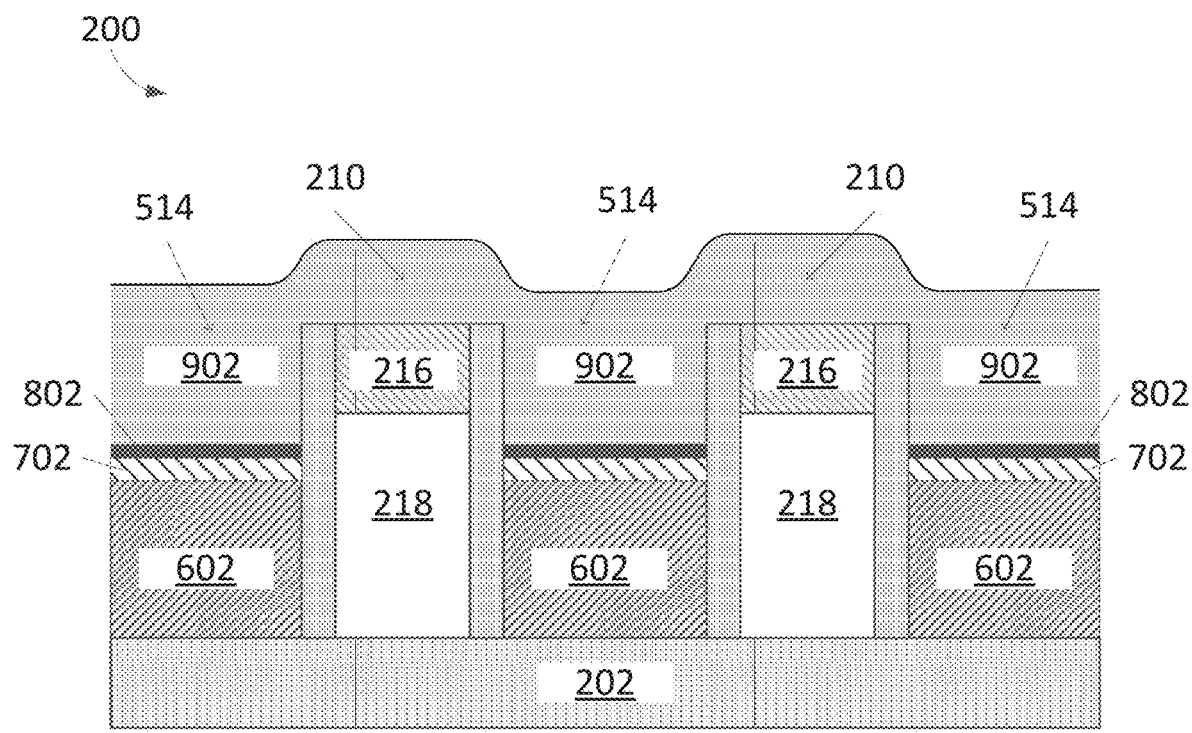
FIG. 9 is a cross-sectional view of an intermediate stage in the formation of the semiconductor structure, according to one embodiment.

In block 120 of FIG. 1, an inter-layer dielectric 902 may be deposited on the metal cap layer 802 in the recess 514 and the gates 210. FIG. 9 is a cross-sectional view of the semiconductor structure 200 at this intermediate stage. The inter-layer dielectric 902 may provide an etch mask for patterning contact via openings, in which a self-aligned contact gate connecting to the recessed metal gate 602, can be formed, and also provide a structural support for the semiconductor structure 200.

The inter-layer dielectric 902 may be any dielectric material, such as silicon nitride (SiN), silicon carbide (SiC), aluminum oxide ($Al_2O_3$), hafnium oxide ($HfO_2$), zirconium oxide ($ZrO_2$), silicon dioxide ($SiO_2$), silicon oxy-nitride ($SiO_xN_y$), or carbon-doped silicon nitride, that has a dielectric constant different from that of the gate cap layers 216 (i.e., the gate dielectric layer 208). The difference in the dielectric constants allows etch selectivity between the inter-layer dielectric 902 and the gate cap layers 216. In some embodiments, the gate cap layers 216 may be made of, for example, silicon nitride silicon nitride ($SiO_3N_4$, dielectric constant K~6) and the inter-layer dielectric 902 may be made of silicon carbide (SiC, K~9.7), high-density-plasma (HDP) silicon (K~7), silicon fluoride, aluminum oxide ($Al_2O_3$, K~8.5-9), hafnium oxide ($HfO_2$, K~40), zirconium oxide ($ZrO_2$, K~24.7), or tantalum oxide ($TaO_5$, K~27). In some embodiments, the inter-layer dielectric 902 may comprise multiple layers of dielectric materials.

The inter-layer dielectric 902 may be deposited over the exposed surface of the semiconductor structure 200 by a conventional CVD, a pulsed-CVD, or atomic layer deposition (ALD) in an eleventh processing chamber. During a pulsed-CVD process, a silicon precursor and a reactant (e.g., another precursor, a reductant, or an oxidizer) are co-flowed and pulsed into the eleventh processing chamber. The substrate may be sequentially exposed to a deposition gas containing the silicon precursor and the reactant. During an ALD process, the silicon precursor and the reactant are sequentially pulsed into the eleventh processing chamber. The substrate may be sequentially exposed to the silicon precursor and the reactant during an ALD process. Plasma enhanced or thermally enhanced deposition techniques may be used during either ALD or CVD processes. The deposition may be advantageously performed at temperatures of less than about 550° C.

Figure 10:
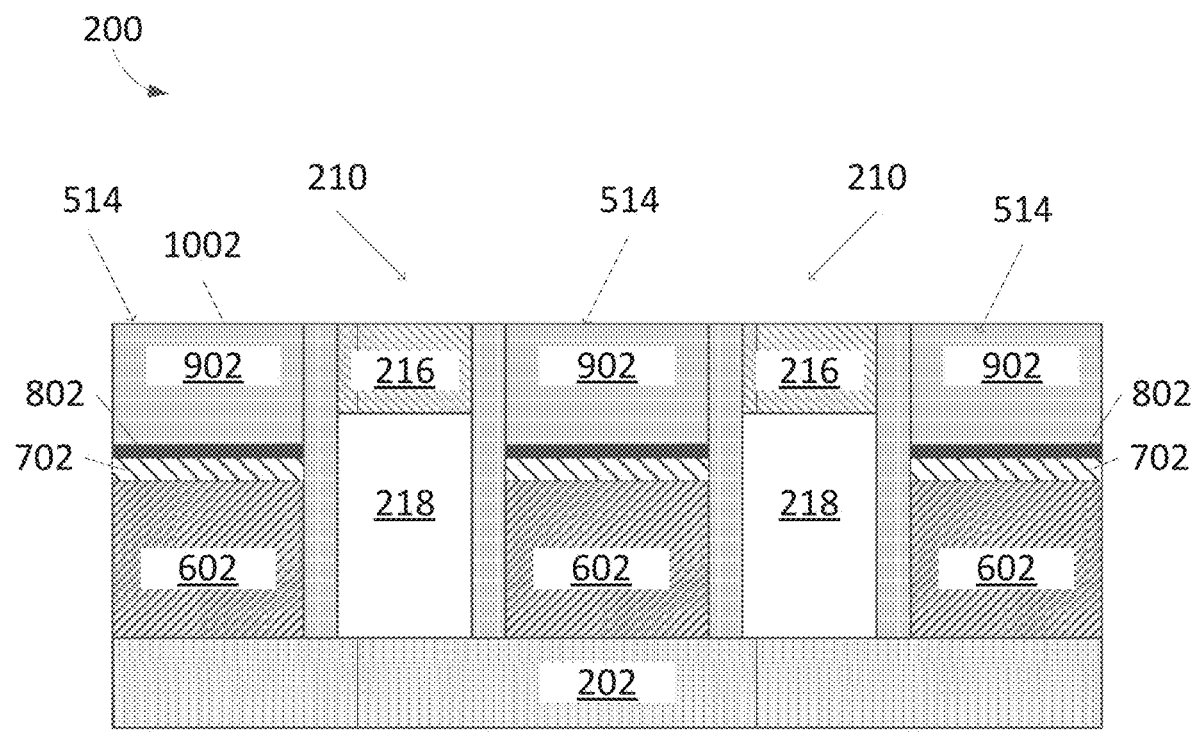
FIG. 10 is a cross-sectional view of an intermediate stage in the formation of the semiconductor structure, according to one embodiment.

In block 122 of FIG. 1, the inter-layer dielectric 902 may be planarized to form an exposed surface 1002. FIG. 10 is a cross-sectional view of the semiconductor structure 200 at this intermediate stage.

In some embodiments, dielectric selective chemical-mechanical planarization (CMP) may be performed in a twelfth processing chamber to remove excess inter-layer dielectric 902 overlying the gates 210. As noted above, the inter-layer dielectric 902 and the gate cap layers 216 have different dielectric constants. Specifically, the exposed surface 1002 of the semiconductor structure 200 is polished both by mechanical abrasion (e.g., abrasion of an overlying first layer to expose a non-planar second layer beneath the first layer) and chemical removal using a slurry (e.g., removal of the first layer at a faster rate than the second layer until the surface of the overlying first layer becomes coplanar with the surface of the second layer). In a CMP process, a polishing pad is mounted on a carrier assembly and positioned in contact with the exposed surface 1002 of the semiconductor structure 200. The carrier assembly provides a controllable pressure to the exposed surface 1002 against the polishing pad. The relative movement of the polishing pad and the exposed surface 1002 mechanically abrades the exposed surface 1002. The mechanical abrasion may be aided by abrasive materials, such as silicon dioxide (silica), cerium oxide (ceria), aluminum oxide (alumina), zirconium oxide (zirconia), and tin oxide. In some embodiments, the slurry that chemically removes the inter-layer dielectric 902 selectively to the gate cap layer 216 comprises at least one acidic buffering agent providing a pH in the range of about 2 to about 7, such as acetic acid, 1-hydroxyethylidene-1,1-diphosphonic acid, glycine, and an inorganic acid including phosphoric acid.

By dielectric selective CMP, the excess inter-layer dielectric 902 may be polished while the gate cap layers 216 are exposed along with areas of the CESLs 220 without a significant amount of material being removed during the polishing process.

Figure 11:
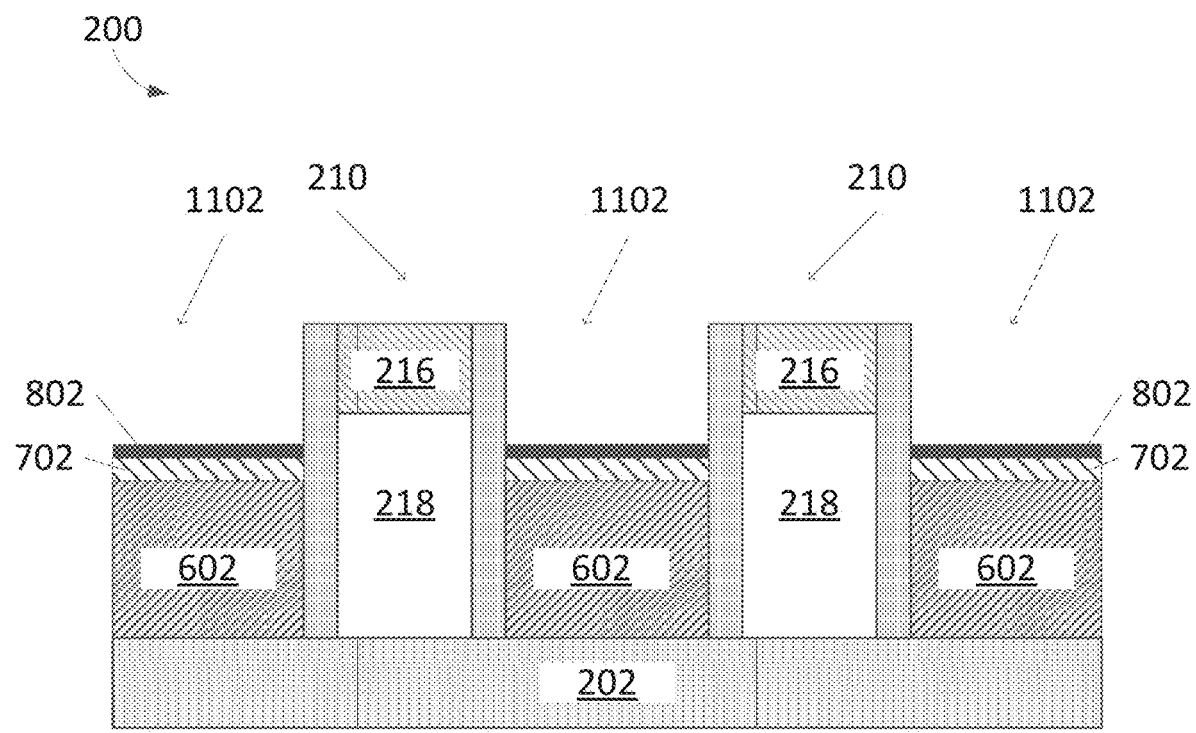
FIG. 11 is a cross-sectional view of an intermediate stage in the formation of the semiconductor structure, according to one embodiment.

In block 124 of FIG. 1, contact via openings 1102 are formed in which a self-aligned contact gate metal can be formed. FIG. 11 is a cross-sectional view of the semiconductor structure 200 at this intermediate stage. The self-aligned contact gate provides an electrical connection to the recessed metal gate 602 from the remainder of the semiconductor structure 200.

Contact via openings 1102 are formed within the recesses 514 to expose the metal cap layer 802 by selectively etching portions of the inter-layer dielectric 902 in a thirteenth processing chamber. During the etching of the inter-layer dielectric 902, the gate cap layers 216 are not etched due to the etch selectivity.

In some embodiments, etching of the inter-layer dielectric 902 utilizes a patterned photoresist layer (e.g. a photomask layer), a bottom anti-refectory coating (BARC)/anti-refectory coating (ARC) layer, and a hardmask layer disposed on the exposed surface 1002 of the semiconductor structure 200.

The patterned photoresist layer is disposed on the top of the BARC/ARC layer. The photoresist layer may be patterned by a conventional lithographic process and has openings which expose portions of the underlying BARC/ARC layer for etching.

In some embodiments, the BARC/ARC layer may be spin-applied on the surface 1002. The BARC/ARC layer may include, for example, organic materials such as SOG, polyamides and polysulfones typically having hydrogen and carbon containing elements, or inorganic materials such as silicon oxynitride, silicon carbide, and the like. In some embodiments, the BARC/ARC layer is an organic material spun-on the surface 1002. The BARC/ARC layer may be alternatively coated, deposited, or otherwise disposed on the surface 1002 by another suitable manner. In some embodiments, the BARC/ARC layer has a thickness between about 300 Å and about 2000 Å, such as between about 600 Å and about 1000 Å.

The hardmask layer may be made of silicon oxide, silicon nitride carbide (SiCN), silicon oxynitride (SiON), amorphous silicon ($\alpha$-Si) or SOG, among other silicon films.

The pattern of the photoresist layer is transferred to the hardmask layer by using a plasma etch process. The pattern is then transferred inter-layer dielectric 902 by a plasma etch process with selectivity to (i.e., without etching) the gate cap layers 216. In some embodiments, the inter-layer dielectric 902 is made of silicon carbide and the gate cap layers 216 are made of silicon nitride, and an etching gas in the plasma etch process includes a hydrogen-containing fluorocarbon gas such as $CH_3F$, an oxygen-containing gas such as $O_2$ and an optional carrier gas such as Ar. In some embodiments, the ratio of the flow rate of $CH_3F$ to the flow rate of $O_2$ can be set at 0.5 to 2.0, preferably 1.25 to 1.75. Pressure in an etch chamber is maintained between about 20 mTorr and about 500 mTorr. RF bias power to maintain a plasma formed within the etch chamber may have a frequency of about 13.56 MHz and be controlled between about 100 Watts to about 1000 Watts.

Examples of the present disclosure provide simplified and accurate processes for device fabrication of sizes 20 nm or less. Since the etch selectivity between two dielectric materials in the chemical-mechanical planarization and the formation of contact vias, the processes may not be affected by misalignment of a patterned mask layer. Furthermore, since the gates are formed of metal (i.e. permanent gates) in the beginning of the processes, there is no need for removal or replacement of the gate later in the processes. The use of liners deposited over recessed active regions may protect the recessed active regions from interacting with dielectric materials on the liner.

Figure 12:
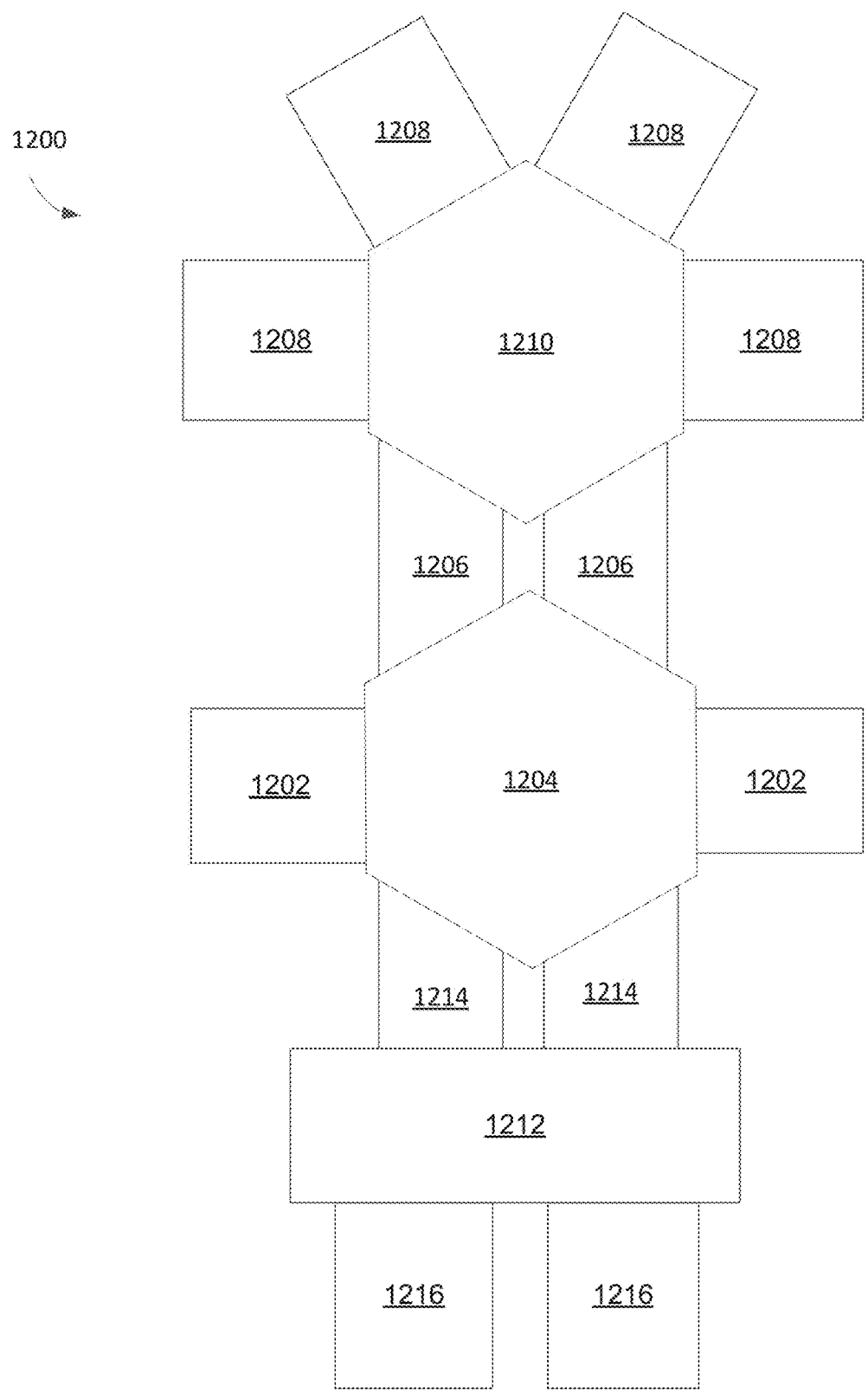
FIG. 12 is a plan view of a processing system.

FIG. 12 illustrates a plan view of a processing system 1200. In one embodiment, blocks 110 to 118 of the method 100 are performed in the processing system 1200. In another embodiment, blocks 110 to 120 of the method 100 are performed in the processing system 1200. The processing system 1200 is an integrated cluster tool that includes a plurality of processing chambers 1202 coupled to a first transfer chamber 1204. In one embodiment, the processing chambers 1202 include the seventh processing chamber in which an ALE process at block 112 of the method 100 is performed, and the tenth processing chamber in which the liner 702 and the metal cap layer 802 are partially removed at block 118 of the method 100. The first transfer chamber 1204 is also coupled to one or more first load lock chambers 1206. The first transfer chamber 1204 has a centrally disposed transfer robot (not shown) for transferring substrates between the processing chambers 1202 and the first load lock chambers 1206. The processing system 1200 also includes a plurality of processing chambers 1208 that are coupled to a second transfer chamber 1210. In one embodiment, the processing chambers 1208 include the sixth processing chamber in which the metallic material 502 is deposited at block 110 of the method 100, the eighth chamber in which the liner 702 is formed at block 114 of the method 100, the ninth chamber in which the metal cap layer 802 is formed at block 116 of the method 100, and the eleventh chamber in which the inter-layer dielectric 902 is deposited at block 120 of the method 100.

The processing system 1200 may include a system controller and service chambers, such as a metrology chamber that is adapted to perform a preparation/analysis step and/or a post-processing/analysis step to analyze a property of a substrate before or after performing a processing step in a processing sequence. In general, the properties of the substrate that can be measured in the metrology chamber may include, but are not limited to, the measurement of the intrinsic or extrinsic stress in one or more layers deposited on a surface of the substrate, film composition of one or more deposited layers, the number of particles on the surface of the substrate, and the thickness of one or more layers found on the surface of the substrate. The data collected from the metrology chamber may then be used by the system controller to adjust one or more process variables in one or more of the processing steps to produce favorable process results on subsequently processed substrates. The controller may include a central processing unit (CPU), memory, and support circuits (or I/O). The CPU may be one of any form of computer processors that are used in industrial settings for controlling various processes and hardware (e.g., pattern generators, motors, and other hardware) and monitor the processes (e.g., processing time and substrate position or location). The memory is connected to the CPU, and may be one or more of a readily available memory, such as random access memory (RAM), read only memory (ROM), floppy disk, hard disk, or any other form of digital storage, local or remote. Software instructions, algorithms and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. The program may be software readable by the controller and may include code to monitor and control, for example, the processing time and substrate position or location.

One such suitable system may be Endure iLB PVD/ALD system with CENTINEL™ chambers from Applied Materials, Inc. in Santa Clara, Calif.

The second transfer chamber 1210 also has centrally disposed transfer robot (not shown) for transferring substrates between the processing chambers 1208 and the first bad lock chambers 1206. A factory interface 1212 is connected to the first transfer chamber 1204 by the second load lock chambers 1214. The factory interface 1212 is coupled to one or more pods 1216 on an opposite side of the second load lock chambers 1214. The pods 1216 are typically front opening unified pods (SOUP) that are accessible from a clean room side.

In one embodiment, the processing system 1200 is a CENTURA® or an ENDURA® platform, both available from Applied Materials, Inc. in Santa Clara, Calif. It is noted that other processing systems available from other manufactures may also be adapted to practice one or more embodiments described herein.

The dry etching and liner deposition processes of blocks 110 and 112, and the layer stack deposition process of blocks 114 and 116 are performed in the processing system 1200 "without breaking vacuum". "Without breaking vacuum", as used herein, refers to the process of transferring the semiconductor structure 200 between the vacuum environment from one chamber, e.g., the sixth processing chamber, to the vacuum environment of a second chamber, e.g., the seventh processing chamber, while maintaining vacuum pressures and without exposing the semiconductor structure 200 to an ambient environment. In the ambient environment, the semiconductor structure 200 may be exposed to mechanical and chemical contaminants, such as particles, moisture, oxygen and the like, that may damage the exposed surface of the semiconductor structure 200 being fabricated. For example, a layer of chlorine may be absorbed on the surface of the recessed metal gate 602, causing defects thereon, and/or other undesired interfacial layers, e.g., native oxide, may be formed between layers while transferring. Therefore, performing the method 100 in the processing system 1200 without breaking vacuum advantageously: (i) minimizes the queue times for exposing the semiconductor structure 200; (ii) prevents defects on the recessed metal gate 602 due to chlorine absorbed the surface thereof and oxidation of the recessed metal gate 602 between the deposition of block 110 and the ALE process of block 112, and between the ALE process of block 112 and the deposition process of block 114, (iii) prevents oxidation of the liner 702, the metal cap layer 802, and the inter-layer dielectric 902 in the layer stack deposition of blocks 114-120.

While the foregoing is directed to specific embodiments, other and further embodiments may be devised without departing from the basic scope thereof, and the scope thereof is determined by the claims that follow.

What is claimed is:

1. A semiconductor structure, comprising:
a first gate and a second gate, each of the first and second gates comprising a first metal on a substrate, wherein a trench is formed between the first and second gates;
a recessed active region comprising a second metal formed in the trench; and
a contact via opening in the trench connectable to a self-aligned contact gate formed within the contact via opening, the self-aligned contact gate electrically connected to the recessed active region.

2. The semiconductor structure according to claim 1, further comprising:
a first gate cap layer comprising a first dielectric material on the first gate and a second gate cap layer comprising the first dielectric material on the second gate.

3. The semiconductor structure according to claim 2, wherein
the first dielectric material is a material selected from the group consisting of silicon nitride, silicon carbide, aluminum oxide, hafnium oxide, zirconium oxide, silicon dioxide, silicon oxy-nitride, and carbon-doped silicon nitride.

4. The semiconductor structure according to claim 2, further comprising:
a first spacer comprising a second dielectric material on sidewalls of the first gate and a second spacer comprising the second dielectric material on sidewalls of the second gate, wherein the first and second spacers are configured to electrically isolate the recessed active region from the first and second gates.

5. The semiconductor structure according to claim 1, wherein
the first metal is a material selected from the group consisting of tungsten, copper, nickel, cobalt, and a metal-semiconductor alloy.

6. The semiconductor structure according to claim 1, wherein the second metal is cobalt.

7. The semiconductor structure according to claim 1, further comprising:
a liner disposed over the recessed active region.

8. The semiconductor structure according to claim 7, wherein
the liner comprises material selected from the group consisting of, titanium nitride, tantalum nitride, and tungsten nitride.

9. The semiconductor structure according to claim 8, further comprising:
a metal cap layer disposed over the liner.

10. The semiconductor structure according to claim 9, wherein
the metal cap layer comprises a material selected from the group consisting of tungsten and ruthenium.

11. A semiconductor structure, comprising:
a first gate and a second gate formed on a substrate, each of the first and second gates comprising a conducting layer of a first metal and a gate dielectric layer of a first dielectric material disposed on the conducting layer, wherein an opening between the first and second gates is partially filled with a second dielectric material, and a trench is formed within the second dielectric material;
a recessed active region formed within the trench, the recessed active region comprising a second metal;
a liner over the recessed active region;
a metal cap layer over the liner;
a third dielectric material over the metal cap layer, wherein a surface of the first and second gates and a surface of the third dielectric material are planarized; and
a contact via opening in the trench.

12. The semiconductor structure according to claim 11, wherein
the first dielectric material is a material selected from the group consisting of silicon nitride, silicon carbide, aluminum oxide, hafnium oxide, zirconium oxide, silicon dioxide, silicon oxy-nitride, and carbon-doped silicon nitride, and the third dielectric material is a material that is selected from the group consisting of silicon nitride, silicon carbide, aluminum oxide, hafnium oxide, zirconium oxide, silicon dioxide, silicon oxy-nitride, and carbon-doped silicon nitride and that has a dielectric constant different from a dielectric constant of the first dielectric material.

13. The semiconductor structure according to claim 11, wherein the second dielectric material is a material selected from the group consisting of silicon carbide-boron nitride, silicon oxycarbide nitride, silicon oxynitride, silicon nitride, silicon dioxide, silicon carbide, silicon nitride carbide, boron nitride, silicon boron nitride, and titanium nitride.

14. The semiconductor structure according to claim 11, wherein the first metal is a material selected from the group consisting of tungsten, copper, nickel, cobalt, and a metal-semiconductor alloy, and the second metal is cobalt.

15. The semiconductor structure according to claim 11, wherein the liner comprises a material selected from the group consisting of, titanium nitride, tantalum nitride, and tungsten nitride, and the metal cap layer comprises a material selected from the group consisting of tungsten and ruthenium.

16. A semiconductor structure, comprising:

a first gate and a second gate formed on a substrate, each of the first and second gate comprising a conducting layer of a first metal and a gate dielectric layer of a first dielectric material disposed on the conducting layer, wherein an opening between the first and second gates is partially filled with a second dielectric material, and a trench is formed within the second dielectric material;

a recessed active region in the trench, the recessed active region comprising a second metal;

a liner over the recessed active region;

a metal cap layer over the liner; and a contact via opening in the trench.

17. The semiconductor structure according to claim 16, wherein the first dielectric material is a material selected from the group consisting of silicon nitride, silicon carbide, aluminum oxide, hafnium oxide, zirconium oxide, silicon dioxide, silicon oxy-nitride, and carbon-doped silicon nitride.

18. The semiconductor structure according to claim 16, wherein the second dielectric material is a material selected from the group consisting of silicon carbide-boron nitride, silicon oxycarbide nitride, silicon oxynitride, silicon nitride, silicon dioxide, silicon carbide, silicon nitride carbide, boron nitride, silicon boron nitride, and titanium nitride.

19. The semiconductor structure according to claim 16, wherein the first metal is a material selected from the group consisting of tungsten, copper, nickel, cobalt, and a metal-semiconductor alloy, and the second metal is cobalt.

20. The semiconductor structure according to claim 11, wherein the liner is made of a material selected from the group consisting of, titanium nitride, tantalum nitride, and tungsten nitride, and the metal cap layer is made of a material selected from the group consisting of tungsten and ruthenium.

* * * * *